(12) United States Patent
Tsong et al.

(10) Patent No.: US 6,306,675 B1
(45) Date of Patent: Oct. 23, 2001

(54) METHOD FOR FORMING A LOW-DEFECT EPITAXIAL LAYER IN THE FABRICATION OF SEMICONDUCTOR DEVICES

(75) Inventors: Ignatius S. T. Tsong; David J. Smith, both of Tempe, AZ (US); Victor M. Torres, Arlington, TX (US); John L. Edwards, Jr., Phoenix; R. Bruce Doak, Tempe, both of AZ (US)

(73) Assignee: Arizona Board of Regents Acting on behalf of Arizona State University, Tempe, AZ (US)

( * ) Notice: Subject to any disclaimer, the term of this patent is extended or adjusted under 35 U.S.C. 154(b) by 0 days.

(21) Appl. No.: 09/414,953

(22) Filed: Oct. 8, 1999

Related U.S. Application Data

(60) Provisional application No. 60/103,661, filed on Oct. 9, 1998.

(51) Int. Cl.[7] .................................................. H01L 21/00
(52) U.S. Cl. ............................................ 438/47; 438/689
(58) Field of Search ........................................ 438/47, 689

(56) References Cited

U.S. PATENT DOCUMENTS

| | | | |
|---|---|---|---|
| 4,643,637 | * | 2/1987 | Strickler ........................... 415/122 R |
| 4,946,547 | * | 8/1990 | Palmour et al. ..................... 156/643 |
| 5,200,022 | * | 4/1993 | Kong et al. ......................... 156/612 |
| 5,426,076 | * | 6/1995 | Moghadam .......................... 437/238 |
| 5,729,029 | * | 3/1998 | Rudaz ................................... 257/13 |
| 5,847,414 | * | 12/1998 | Harris et al. .......................... 257/77 |
| 5,900,647 | * | 5/1999 | Inoguchi ................................ 257/76 |
| 6,091,083 | * | 7/2000 | Hata et al. ............................. 257/79 |

OTHER PUBLICATIONS

Hallin et al, "In situ substrate preparation for high–quality SiC chemical vapor deposition," *Journal of Crystal Growth* 181, pp. 241–253 (1997).

Torres et al., "Growth of AlN and GaN on 6H–SiC(0001) Using a Helium Supersonic Beam Seeded with Ammonia," *Appl. Phys. Lett.* 71 (10), pp. 1365–1367 (Sep. 8, 1997).

Owman et al., "Removal of polishing–induced damage from 6H–SiC(0001) substrates by hydrogen etching," *Journal of Crystal Growth* 167, pp. 391–395 (1996).

* cited by examiner

*Primary Examiner*—Long Pham
*Assistant Examiner*—Ravindra B. Shukla
(74) *Attorney, Agent, or Firm*—Baker Botts L.L.P.

(57) ABSTRACT

In semiconductor devices such as laser diodes (LD) and light emitting diodes (LED) based on gallium nitride thin films, low defect density is desired in the gallium nitride film. In the fabrication of such devices on a silicon carbide substrate surface, the gallium nitride film is formed on the silicon carbide substrate after the substrate surface is etched using hydrogen at an elevated temperature. In another embodiment, an aluminum nitride film is formed as a buffer layer between the gallium nitride film and the silicon carbide substrate, and, prior to aluminum nitride formation, the substrate surface is etched using hydrogen at an elevated temperature.

12 Claims, 4 Drawing Sheets

1

METHOD FOR FORMING A LOW-DEFECT EPITAXIAL LAYER IN THE FABRICATION OF SEMICONDUCTOR DEVICES

This application claims the benefit of U.S. Provisional Application Serial No. 60/103,661, filed Oct. 9, 1998.

This invention was made with support from the U.S. Government under Office of Naval Research Grant No. N00014-95-1-0122 and National Science Foundation MRSEC program DMR-9632635. The U.S. Government has certain rights in the invention.

BACKGROUND OF THE INVENTION

This invention relates to heteroepitaxial layer formation in the fabrication of semiconductor devices and, more particularly, to such formation on a silicon carbide substrate surface.

Increasingly, laser diodes (LD) and light emitting diodes (LED) based on gallium nitride (GaN) thin films are being used because of their range of electrical, thermal, and optical properties. For a GaN-based laser diode to have a long life, i.e. several thousand hours of continuous operation, it is important to minimize the density of defects (usually in the form of dislocations) in the GaN film. This requires a defect density of less than about $1 \times 10^7$ cm$^{-2}$ (i.e. less than 10 million defects per square centimeter).

One attempt at achieving such a low defect density involves complex schemes of growing the GaN film epitaxially on a sapphire substrate. These growth schemes are time consuming, and their use impedes commercialization of devices based on GaN.

Another attempt is to grow the GaN thin film using a silicon carbide (SiC) substrate with a buffer layer of aluminum nitride (AlN) between the substrate and the GaN film. Such an attempt has potential because the GaN/AlN/SiC system has close matching of lattice parameters, namely 3.19/3.11/3.08 Å. Prior heteroepitaxial structures of GaN and AlN on a SiC substrate have been fabricated as described in Torres et al., "Growth of AlN and GaN on 6H-SiC(0001) Using a Helium Supersonic Beam Seeded with Ammonia," *Appl. Phys. Lett.* 71 (10) (Sep. 8, 1997). In that process, the SiC substrate was first degreased, deoxidized, and degassed up to 500° C. Then, the SiC substrate was annealed to 900° C. for 20 minutes. Next, a buffer layer of AlN was grown on the SiC substrate at a temperature of between 560 and 1000° C. Finally, a GaN layer approximately 0.1 μm thick was grown on the AlN layer at a temperature exceeding 700° C. In a typical structure where the AlN layer was grown at 900° C. and the GaN layer was grown at 800° C., defect densities of $2 \times 10^{11}$ cm$^{-2}$ and $2 \times 10^{10}$ cm$^{-2}$ were measured for the AlN and GaN layers, respectively. Notwithstanding the reasonably good lattice matching of the GaN/AlN/SiC system, this process still produced relatively high defect densities.

Hallin et al., in "In situ preparation for High-Quality SiC Chemical Vapour Deposition," *J. Crystal Growth* 181, pp. 241–53 (1997), have shown that etching a SiC substrate in hydrogen at 1500 to 1600° C. improves the quality, with respect to defect formation, of an epitaxial layer grown on the substrate. However, a GaN thin film heteroepitaxial structure has still not been fabricated with low defect density.

SUMMARY OF THE INVENTION

The object of the present invention is to provide such a low-defect density gallium nitride heteroepitaxial structure, and a method for making such a structure.

On a silicon carbide surface, a gallium nitride film or a quantum-well heterostructure using alloys of indium nitride (InN), gallium nitride, and aluminum nitride is formed on the silicon carbide substrate. Prior to gallium nitride film formation, the substrate surface is held at an elevated temperature and exposed to hydrogen for etching to remove mechanical damage and defects and so as to reveal atomic steps and terraces for heteroepitaxial deposition of gallium nitride. The resulting interface between the silicon carbide and the gallium nitride is sharp and clean, and low defect density is achieved on the surface of the gallium nitride film or quantum-well heterostructure formed on the silicon carbide substrate.

Alternatively, on a SiC surface, an aluminum nitride film may be formed as a buffer layer, and a gallium nitride film or a quantum-well heterostructure using alloys of indium nitride, gallium nitride, and aluminum nitride is formed on the aluminum nitride film. Prior to aluminum nitride layer formation, the substrate surface is held at an elevated temperature and exposed to hydrogen for etching to remove mechanical damage and defects and so as to reveal atomic steps and terraces for heteroepitaxial deposition of aluminum nitride. With a resulting interface between the silicon carbide and the aluminum nitride which is sharp and clean, low defect density is achieved in the gallium nitride film or quantum-well heterostructure formed on the aluminum nitride layer.

Preferably, in both types of structures the etching of the substrate is performed at a temperature from about 1550 to 1700° C. Preferably, the substrate is also exposed to a mixture of hydrogen and at least one inert gas, such as helium or argon. In preferred embodiments, the aluminum nitride layer and the gallium nitride film or quantum-well heterostructure are formed using selected energy epitaxy (SEE) deposition. Alternatively, these layers can be formed using molecular beam epitaxy deposition.

BRIEF DESCRIPTION OF THE DRAWINGS

For a more complete understanding of the present invention and the advantages thereof, reference is now made to the following description taken in conjunction with the accompanying drawing, wherein like reference numerals represent like parts, in which.

DETAILED DESCRIPTION OF THE INVENTION

Matching of lattice parameters alone is insufficient for making defect-free films. It has been found that high defect density in gallium nitride films of GaN/AlN/SiC heterostructures is due largely to dislocations propagating from the AlN/SiC buffer/substrate layer interface, with such interface dislocations in turn originating from inherent defects and imperfections on the silicon carbide substrate surface. Thus, dislocations on the AlN layer such as threading defects can be attributed to stacking mismatch boundaries at the SiC/AlN interface. This type of defect is formed when two neighboring islands coalesce at a substrate step. Islands grown on adjacent SiC terraces display stacking sequences that are dictated by the respective stacking sequence of the underlying substrate. Upon coalescence, a mismatch boundary is produced, implying that stacking faults or dislocations parallel to the surface will be produced. The process of the present invention therefore removes such defects from the SiC substrate prior to deposition of the additional layers.

One process of the present invention comprises removing the inherent defects prior to the deposition of the AlN buffer layer by etching the SiC substrate surface in a stream containing hydrogen, at atmospheric pressure and at high temperature. The AlN buffer layer is then deposited on the etched SiC substrate, followed by growth of a GaN film.

Figure 1A:
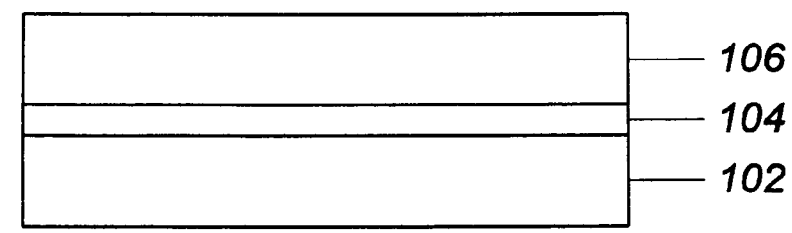
FIGS. 1A and 1B are schematic cross-sectional representations of GaN heterostructures fabricated according to an embodiment of the present invention.
Figure 1B:
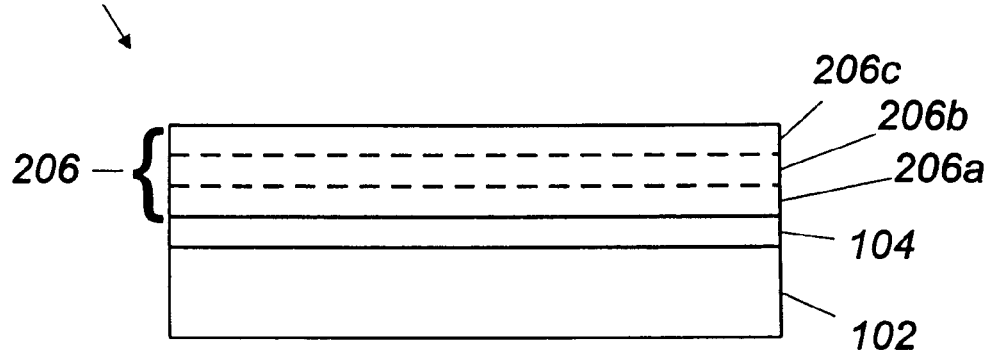

FIGS. 1A and 1B are schematic representations of GaN heterostructures 10, 20 fabricated according to an embodiment of the present invention. Heterostructure 10 is made up of SiC substrate 102, AlN buffer layer 104, and GaN film 106. Heterostructure 20 is similar except that GaN film 106 is replaced by quantum-well heterostructure 206 which is made of layers 206a, 206b, 206c. Three layers are schematically drawn, although a range of a number of layers can be used as is known in the art. These layers can be alloys of AlN, InN, and GaN.

In one embodiment, SiC substrate 102 is initially degreased in methanol, acetone, and isopropanol for five minutes each, at a temperature of 65° C. The substrate is then dipped in a 10% HF aqueous solution for fifteen minutes to remove the oxide. The substrate is then etched while being held in a stream containing hydrogen, at atmospheric pressure and at a temperature in a preferred range from 1550 to 1700° C. The stream may be made of pure hydrogen or it may include a considerable component other than hydrogen, e.g., 80–95 vol. % of an inert gas such as helium or argon. In one embodiment of the present invention, the SiC substrate is etched in a stream of pure hydrogen for fifteen minutes at atmospheric pressure and at a temperature of 1600° C. The etched substrate is then removed from the etching furnace.

Figure 2:
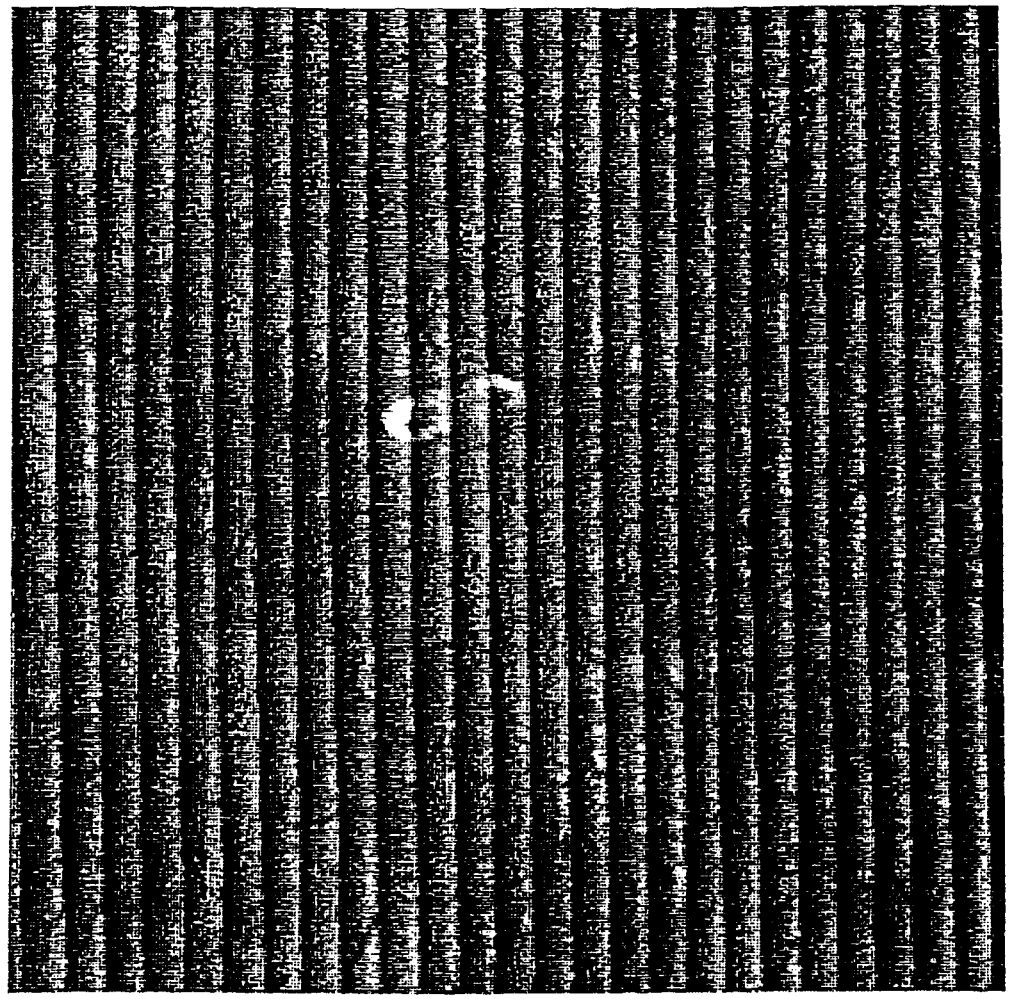
FIG. 2 is an atomic force microscope image of the SiC surface formed in accordance with an intermediate step of a preferred embodiment of the invention.

FIG. 2 is an atomic force microscope image of the SiC substrate surface after hydrogen etching at 1600° C. The periodic steps are approximately 400 nm wide and 1.5 nm high. These regular 1.5 nm steps are terminated with the same stacking sequence.

Once SiC substrate 102 has been etched, it is placed in a deposition chamber evacuated to ultrahigh vacuum. In the chamber, the substrate is degassed by heating up to 500° C. and then annealed at 900° C. The AlN 104 and GaN 106 layers are then deposited and grown using selected energy epitaxy (SEE). In this SEE method, approximately 10–20 atomic layers of AlN are formed by reacting ammonia (NH$_3$), seeded in a supersonic helium beam, with aluminum metal atoms evaporated from a knudsen cell. The layers are grown at 900° C. with an Al flux of $2.5 \times 10^{14}$ cm$^{-2}$ s$^{-1}$ and a NH$_3$ flux of $3.5 \times 10^{14}$ cm$^{-2}$ s$^{-1}$. A several micrometer thick GaN film 106 is then formed by directing onto the AlN layers 104 a flux of gallium atoms evaporated from a gallium knudsen cell, and the gallium then reacts with the ammonia.

To form quantum-well heterostructure 20, after AlN layer 104 is deposited on SiC substrate 102, quantum well 206 is formed on AlN layer 104 and may be combined with AlN, InN, and/or GaN to form various alloys.

Figure 3A:
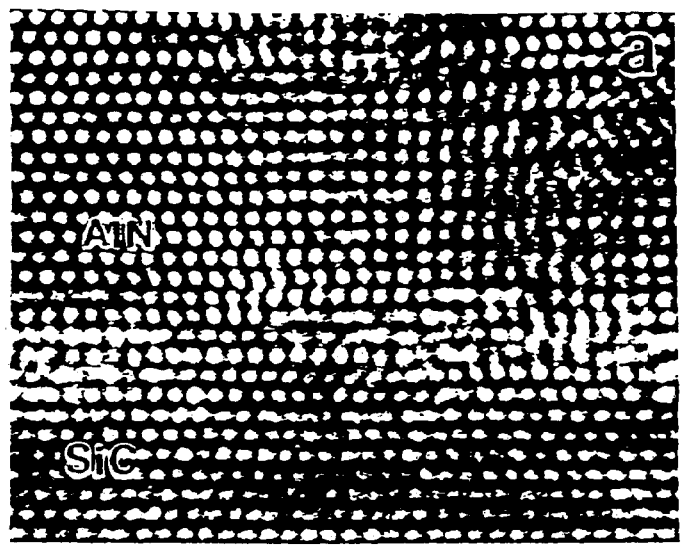
FIGS. 3A and 3B are high-resolution TEM images of the AlN/SiC interface formed in accordance with the prior art and in accordance with a preferred embodiment of the invention, respectively.
Figure 3B:

FIGS. 3A and 3B are high-resolution cross-sectional transmission electron microscopy (TEM) images of the interface between the SiC substrate and the AlN buffer layer. FIG. 3A shows the results of the prior art Torres et al. process. FIG. 3B shows the results of an embodiment of the present invention and reveals a sharp, clean interface. An arrow points to the interface between the AlN film and the SiC substrate. In FIG. 3B, a near-perfect epitaxial relationship is observed between the AlN buffer layer and the SiC substrate with very few interface defects.

While this embodiment includes a buffer layer of AlN, because lattice matching alone is not the primary cause of producing low-defect density films, it may also be that the AlN buffer layer is not needed, and the GaN film may be deposited directly onto the silicon carbide substrate after the substrate has been etched in hydrogen at elevated temperature, as described above.

Figure 4A:
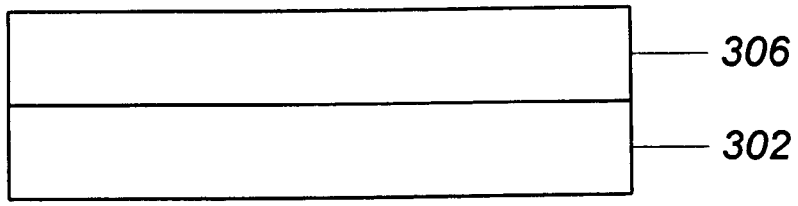
FIGS. 4A and 4B are schematic cross-sectional representations of additional GaN heterostructures fabricated according to another embodiment of the present invention.
Figure 4B:
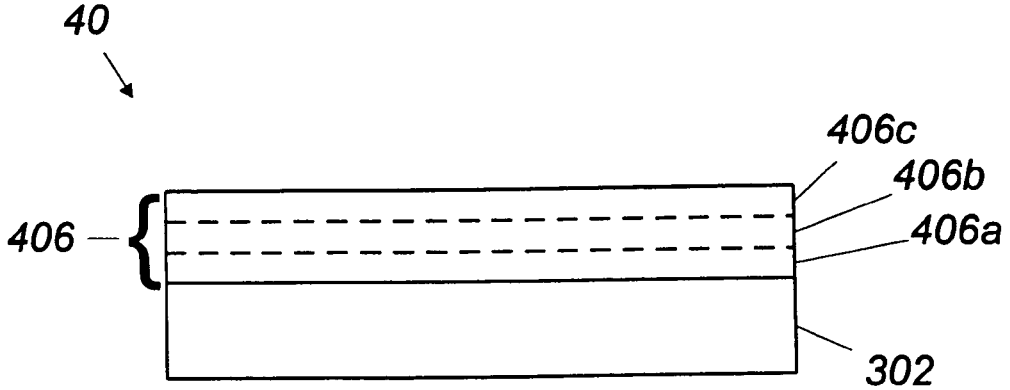

FIGS. 4A and 4B are schematic representations of GaN heterostructures 30, 40 fabricated according to another embodiment of the present invention. Heterostructure 30 is made up of SiC substrate 302 and GaN film 306. Heterostructure 40 is similar except that GaN film 306 is replaced by quantum-well heterostructure 406 which is made of layers 406a, 406b, 406c. Three layers are schematically drawn, although a range of a number of layers can be used as is known in the art. These layers can be alloys of AlN, InN, and GaN.

In this embodiment, SiC substrate 302 is prepared as before, being degreased and deoxidized. Then the substrate is etched while being held in a stream containing hydrogen, at atmospheric pressure and at a temperature in a preferred range from 1550 to 1700° C. Again, the stream may be made of pure hydrogen or it may include a considerable component other than hydrogen, e.g., 80–95 vol. % of an inert gas such as helium or argon. After etching, the etched substrate 302 is removed from the etching furnace and placed in a deposition chamber evacuated to ultrahigh vacuum. In the chamber, the substrate is degassed by heating up to 500° C. and then annealed at 900° C. The GaN 306 film is then deposited and grown using SEE. To form quantum-well heterostructure 40, quantum well 406 is formed on SiC substrate 302 and may be combined with AlN, InN, arid/or GaN to form various alloys.

The heteroepitaxial GaN structures may be fabricated using methods other than SEE. Known methods of molecular beam epitaxy (MBE), such as gas-source MBE or plasma-assisted MBE, and other methods such as metal-organic chemical vapor deposition (MOCVD) and hydride vapor phase deposition (HVPE), may also be effective.

While several embodiments of GaN heterostructures have been illustrated and described, other variations and alternate embodiments will occur to those skilled in the art. These variations and embodiments are still within the spirit and scope of this invention.

We claim:

1. A method for making a semiconductor structure on a silicon carbide substrate surface, comprising:
   etching the substrate surface in a hydrogen-containing atmosphere; and
   forming a gallium nitride film or a quantum-well heterostructure on the etched surface, said quantum-well heterostructure comprising alloys of indium nitride, gallium nitride, and aluminum nitride.

2. The method of claim 1, wherein said etching is performed at a temperature in a range from 1550 to 1700° C.

3. The method of claim 1, wherein the atmosphere further contains at least one inert gas.

4. The method of claim 3, wherein the inert gas is helium or argon.

5. The method of claim 3, wherein the atmosphere is made up of 80–95 vol. % inert gas.

6. The method of claim 1, wherein the gallium nitride film or quantum-well heterostructure is formed using selected energy epitaxy deposition or molecular beam epitaxy deposition.

7. A method for making a semiconductor structure on a silicon carbide substrate surface, comprising:

etching the substrate surface in a hydrogen-containing atmosphere;

forming an aluminum nitride layer on the etched surface; and forming a gallium nitride film or a quantum-well heterostructure on the aluminum nitride layer, said quantum-well heterostructure comprising alloys of indium nitride, gallium nitride, and aluminum nitride.

8. The method of claim 7, wherein said etching is performed at a temperature in a range from 1550 to 1700° C.

9. The method of claim 7, wherein the atmosphere further contains at least one inert gas.

10. The method of claim 9, wherein the inert gas is helium or argon.

11. The method of claim 9, wherein the atmosphere is made up of 80–95 vol. % inert gas.

12. The method of claim 7, wherein the aluminum nitride layer and the gallium nitride film or quantum-well heterostructure are formed using selected energy epitaxy deposition or molecular beam epitaxy deposition.

* * * * *

UNITED STATES PATENT AND TRADEMARK OFFICE
CERTIFICATE OF CORRECTION

PATENT NO.   : 6,306,675 B1
DATED        : October 23, 2001
INVENTOR(S)  : Tsong et al.

It is certified that error appears in the above-identified patent and that said Letters Patent is hereby corrected as shown below:

Title page,
Item [73] Assignee, "Acting" should read -- acting --

Column 1,
Line 55, "Eligh-Quality" should read -- High Quality --

Column 3,
Lines 57 and 62, "knudsen" should read -- Knudsen --

Signed and Sealed this

Seventh Day of May, 2002

Attest:

Attesting Officer

JAMES E. ROGAN
Director of the United States Patent and Trademark Office